United States Patent [19]

Hirao et al.

[11] Patent Number: 4,949,153

[45] Date of Patent: Aug. 14, 1990

[54] SEMICONDUCTOR IC DEVICE WITH POLYSILICON RESISTOR

[75] Inventors: Tadashi Hirao; Kiyoshi Sakaue; Hisao Yakushiji; Saburo Ohsaki, all of Itami, Japan

[73] Assignee: Mitsubishi Denki Kabushiki Kaisha, Tokyo, Japan

[21] Appl. No.: 362,232

[22] Filed: Jun. 6, 1989

Related U.S. Application Data

[63] Continuation of Ser. No. 32,372, Mar. 31, 1987, abandoned.

[30] Foreign Application Priority Data

Apr. 7, 1986 [JP] Japan ................................. 61-80584

[51] Int. Cl.$^5$ ............................................ H01L 27/02
[52] U.S. Cl. ...................................... 357/51; 357/59; 357/34; 357/43
[58] Field of Search ...................... 357/40, 41, 51, 34, 357/59, 43, 59 I

[56] References Cited

U.S. PATENT DOCUMENTS

| 4,201,603 | 5/1980 | Scott, Jr. et al. | 148/174 |
| 4,210,996 | 7/1980 | Amemiya et al. | 357/59 F X |
| 4,411,708 | 10/1983 | Winham | 148/1.5 |
| 4,436,582 | 3/1984 | Saxena | 357/71 S X |
| 4,489,104 | 12/1984 | Lee | 427/101 |
| 4,665,424 | 5/1987 | Hirao | 357/34 |
| 4,691,223 | 9/1987 | Murakami et al. | 357/34 X |
| 4,705,599 | 11/1987 | Suda et al. | 357/34 X |
| 4,707,723 | 11/1987 | Okamoto et al. | 357/71 S X |
| 4,722,908 | 2/1988 | Burton | 357/34 X |
| 4,729,965 | 3/1988 | Tamaki et al. | 357/67 S X |
| 4,729,969 | 3/1988 | Suda et al. | 357/67 S X |
| 4,735,680 | 4/1988 | Yen | 357/67 S X |

FOREIGN PATENT DOCUMENTS 0056908  8/1982  European Pat. Off. ........... 357/71 S
0145926  6/1985  European Pat. Off. .
61-147572  7/1986  Japan .
2102625  2/1983  United Kingdom .

OTHER PUBLICATIONS

Sequeda, "The Role of Thin Film Materials on the Technology of Integrated Circuit Fabrication", *Journal of Metals*, Nov. 1985, 54–59.

Nishimura et al., "A Bipolar 18K Gate Variable-Size Cell Masterslice", *ISCC* 1986 *Digest of Technical Papers*, pp. 76, 77, 313; WPM 7.5, Feb. 19, 1986, IEEE.

Hirao et al., "A 2.1-G Hz 56 mW Two-Modulus Prescaler IC Using Salicide Base Contact Materials", *Extended Abstracts of 17th Conference on Solid State Devices and Materials*, Tokyo, 1985, pp. 381–384.

Ho et al., "Self-Aligned Process for Forming Metal-Silicide and Polysilicon Composite Base Contact", *IBM Technical Disclosure Bulletin*, vol. 22, No. 12, May. 80, 5336–38.

Chu et al., "Metal-Silicide Layer for the Post Emitter Base Implantation Process," *IBM Technical Disclosure*, vol. 21, No. 2, Jul. 78, 580–81.

*Primary Examiner*—William Mintel
*Attorney, Agent, or Firm*—Saidman, Sterne, Kessler & Goldstein

[57] ABSTRACT

A semiconductor integrated circuit device includes: an active device, such as a bipolar transistor and a resistor formed of a first silicon layer formed on a thick insulating film on the semiconductor substrate. A metal silicide film is formed on the surface of said first silicon layer for connection between the first silicon layer and an interconnection layer. The interconnection layer has contact with a first and a second part of the metal silicide film formed on a opposited sides of an isulating film on first silicon layer. The part of the first silicon layer under the insulation film and between the first and second parts of the metal silicide film forms the resistor.

15 Claims, 5 Drawing Sheets

SEMICONDUCTOR IC DEVICE WITH POLYSILICON RESISTOR

This application is a continuation, of application Ser. No. 07/032,372, filed 3/31/87 now abandoned.

BACKGROUND OF THE INVENTION

This invention relates to semiconductor integrated circuit devices and methods of fabricating the same, and in particular to an improvement in the method of forming transistors and the contacts of resistors connected to these transistors in a bipolar semiconductor integrated circuit device (bipolar IC).

The transistors of a bipolar IC are formed in electrically isolated islands, the isolation being achieved by means of pn junctions, oxide films formed by selective oxidation, or the techniques using triple diffusion. The fabrication of an npn transistor by oxide film isolation is described below. However, the present invention applies to the other methods of isolation as well, and also to pnp transistors.

The components of a bipolar IC are generally transistors, diodes, and resistors. Diode fabrication is similar to transistor fabrication, so the example discussed below is that of a transistor-resistor circuit in which a resistor R is connected to the base B of a transistor Tr as shown in FIG. 5.

This device is conventionally fabricated as shown in FIGS. 6a to 6e. The prior art fabrication method will be described with reference to these figures.

First, a first and a second n-type (n+-type) layer 2a and 2b of high impurity concentration are selectively formed in a p-type (−-type) silicon substrate 1 of low impurity concentration, as in FIG. 6a. The first of these layers 2a will become the buried collector. Next an n−-type epitaxial layer 3 is grown over these layers.

On this n−-type epitaxial layer 3 are next formed first an oxide underfilm 101 and then a nitride film 201 as in FIG. 6b. The nitride film is patterned to form a mask for selective oxidation to create a thick isolation oxide film 102 surrounding the transistor-forming region and the resistor-forming region. At the same time, a p-type channel-cut layer 4 is created below the isolation oxide film 102. That part of the n−-type epitaxial layer 3 remaining in the transistor forming region becomes the collector region of the transistor, which will be called a first n−-type epitaxial layer. The part of the n−-type epitaxial layer 3 remaining in the resistor region will be called a second n−-type epitaxial layer.

Next the nitride film 201, used as mask in the selective oxidation described above, is stripped off together with the oxide underfilm 101 and a new oxide film 103 is formed over the n−-type epitaxial layers 3a and 3b for protection during ion implantation, as shown in FIG. 6c. A p+-tupe layer 5 that has one side adjacent to the isolation oxide 102 which separates the transistor region from the resistor region, and becomes the external base region is then created by ion implantation, using a photoresist film (not shown in the figure) as a mask, on a part of the surface of the first n−-type epitaxial layer 3a. Then the photoresist film is stripped off, a new photoresist film 301 is formed, and a second ion implantation is carried out, using the photoresist film as the mask, to create a p-type layer 6 in the surface of the first n−-type epitaxial layer 3a adjacent to the external base region 5, this layer 6 becoming the active base region, and a p-type layer 9 that becomes the resistor region in the second n−-type epitaxial layer 3b.

Next the photoresist film 301 is stripped off and a passivation film 401, usually made of phophosilicate glass (PSG), is deposited over the entire surface as in FIG. 6d. Heat treatment is then conducted to anneal the external base region 5, the active base region 6, and the resistor region 9, formed by ion implantation and to sinter the PSG layer 401 to form the external base region 5 and the active base region 6 and the resistor region 9. Then windows 70 and 80 are opened in the PSG layer 401 and ion implantation is conducted to form an n+-type region 7, which is to become the emitter, in part of the surface of the active base region 6 and an n+-type region 8, which is to become the collector contact, in part of the surface of the first n−-type epitaxial layer 3a.

The ion-implanted regions are annealed to complete the formation of the external base region 5, the active base region 6, and the resistor region 9. The emitter region 7 and the collector contact region 8 are created, followed by the base contact window 50 and the resistor contact windows 91 and 92, as in FIG. 6e. A metal silicide film 501 (platinum slicide (Pt-Si), palladium silicide (Pd-Si), or the like) for preventing contact junction spiking is then deposited in the windows 50, 70, 80, 91 and 92, and then a low-resistance metal such as aluminum is deposted to form base electrode interconnection 12, emitter electrode interconnection 10, collector electrode interconnection 11, resistor-to-base interconnection 13 and resistor electrode interconnection 14.

FIG. 7 is a plan view of a transistor fabricated by the prior art method described above. The frequency characteristics of the transistor depend on the base-collector capacitance and the base resistance, and these two factors need to be reduced to improve the frequency characteristics. The purpose of the external base region 5 in the structure described above is to reduce the base resistance, but this has the drawback of increasing the base-collector capacitance. The base resistance also depends on the distance $D_1$ between the emitter region 7 and the base contact window 50. In the prior art $D_1$ is the sum of the gap between the base contact interconnection line 12 and the emitter contact interconnection line 10 and the amounts by which these interconnection lines 12 and 10 project from the contact windows 50 and 70. Improved photoetching accuracy can reduce the gap between the interconnection lines, but the reduction in $D_1$ has been limited because of the interconnection lines projecting from the windows.

Moreover, the resistor region 9 connected to the base of the transistor is formed by diffusioon, so that it must be isolated by the oxide film 102 from the transistor region, and the base-to-resistor interconnection 13 and the resistor contact interconnection 14 are provided, thereby restricting the routing of further interconnection lines over the resistor region 9. As a result, it is difficult to achieve higher integration densities. In addition, since the resistor region 9 is isolated by a p-n junction, it has a capacitance, which also causes frequency degradation.

The difficulty associated with the provision of additional interconnection lines over the resistor region is described below. In the bipolar intergrated circuit, it sometimes happens that, as shown in FIG. 8, additional interconnection lines 16 and 17 (two lines are illustrated, but there can be more) are routed over the resistor 9. In this case, the length of the resistor 9 is large and hence the width of the resistor must be large to obtain a relatively small resistance. This is because the resistance value is proportional to the length (L in the figure) between the contact parts 91 and 92 of the interconnection 13 and 14 and inversely proportional to the resistor width (W in the figure) so that when many interconnection lines must be routed over the resistor, the length L is increased, and hence it is necessary to increase the width W by a large amount to obtain a small resistance value. Thus with the prior art, large resistor sizes are required and integration density is lowered and the capacitance of the resistor is increased, and the characteristics may be degraded.

In the master-slice technology, in which the resistors which have been formed are altered at the step of forming the resistor contact windows and the subsequent steps, the diffusion is performed to provide the maximum resistance (maximum L) that might be needed in the final device, and the contact windows 91 and 92 are formed in the subsequent fabrication process at a separation corresponding tot he resistance actually desired, as shown in FIG. 9. Accordingly, even resistors with small resistance values have the capacitance of the maximum resistor. This excess capacitance degrades the characteristics of the device.

SUMMARY OF THE INVENTION

An object of the present invention is to improve high-frequency characteristics.

Another object of the invention is to increase the density of integration.

A further object of the invention is to increase the degree of freedom in design.

According to one aspect of the invention, there is provided a semiconductor integrated circuit device including, an active device, a resistor formed of a first silicon layer formed on a thick insulating film on the semiconductor substrate, and a metal silicide film formed on the surface of the first silicon layer for connection between the first silicon layer and an interconnection layer.

According to another aspect of the invention there is provided a method of ffabricating a semiconductor integrated circuit device including a bipolar transistor and a resistor, including the steps of: forming, on a semiconductor substratre, a basic silicon layer forming an electrically isolated collector region, and a thick insulating film; introducing predetermined impurities into the first silicon layer; forming an insulating film on the first silicon layer and the region for the transistor; partially removing the insulating film to open a window at the base contact region; partially removing the insulating film covering the first silicon layer to form windows, the separation between the windows being determined by the required resistance value; forming a metal silicide film in the windows on the base contact, and in the windows on the surface of the first silicon layer where the insulating film has been removed; and, forming a dielectric passivation layer over the regions for the transistor and the resistor, and then opening contact windows in this passivation layer, and then forming low-resistance, interconnections.

In this invention, the metal silicide provides an interconnection from the emitter and base regions to their low-resistance electrodes. The distance between the emitter and base can be reduced to the limits of photolithographic alignment without restrictions imposed by the low-resistance electrode formation. The resulting small emitter-to-base distance reduces the base resistance. In addition, the emitter-base junction is shallow, which improves the frequency characteristics of the transistor. Furthermore, since the first silicon layer is formed on the field oxide film, there is no increased capacitance, and since the resistance of the first silicon layer is determined by the metal silicide film, there is no need to enlarge the width of the resistor.

DESCRIPTION OF THE PREFERRED EMBODIMENTS

Figure 1:
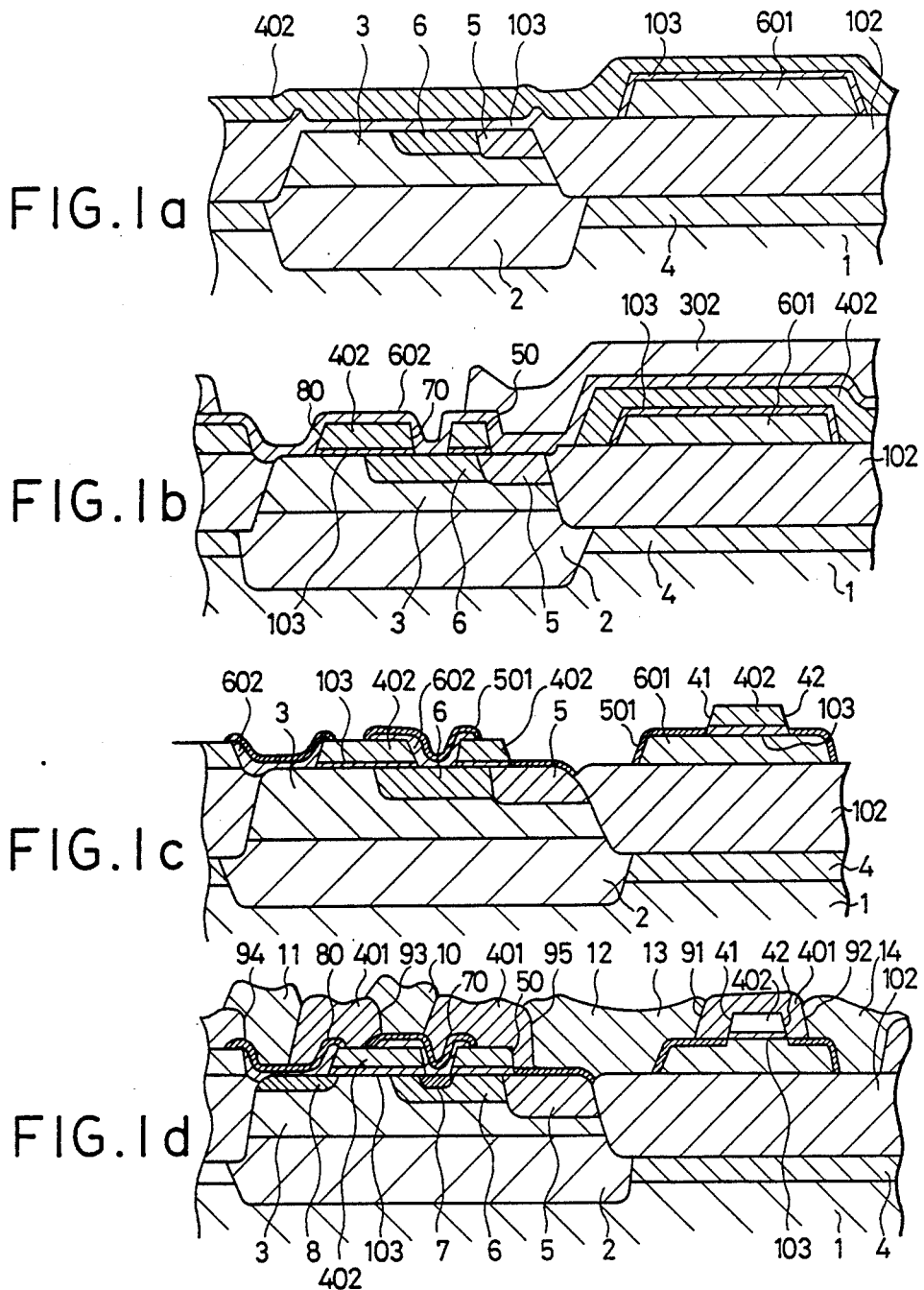
FIGS. 1a to 1d are a sectional view showing the main steps in the fabrication of an embodiment of this invention.

An embodiment of this invention is described below with reference to the drawings.

FIGS. 1a to 1d are sectional views showing the states at various steps of a fabrication process of an embodiment of this invention. Those parts having corresponding parts in the prior art shown in FIG. 6 are given the same numbers as in FIG. 6. Reference numeral 601 denotes a resistor layer (a first polysilicon layer) formed on the isolation oxide film 102, 602 denotes a second polysilicon layer formed over the emitter region, and 501 denotes a metal silicide layer formed on the second polysilicon layer 602 and the resistor layer 601.

Next the fabrication process is described.

Figure 6A:
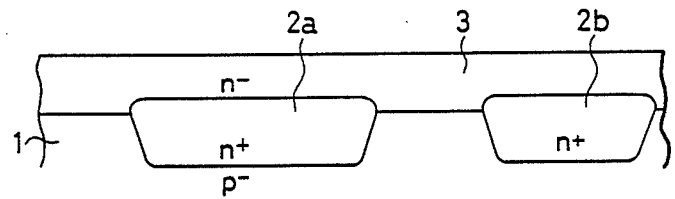
FIGS. 6a to 6e are a sectional view showing the main steps in the fabrication process of the prior art.
Figure 6B:
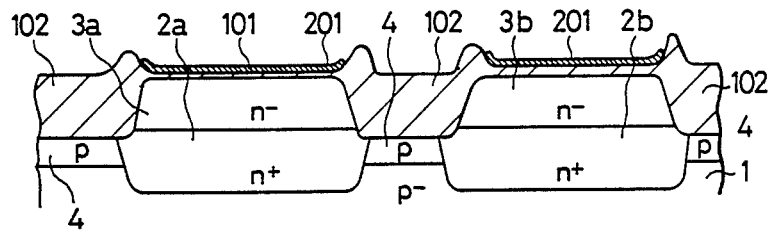
Figure 6C:
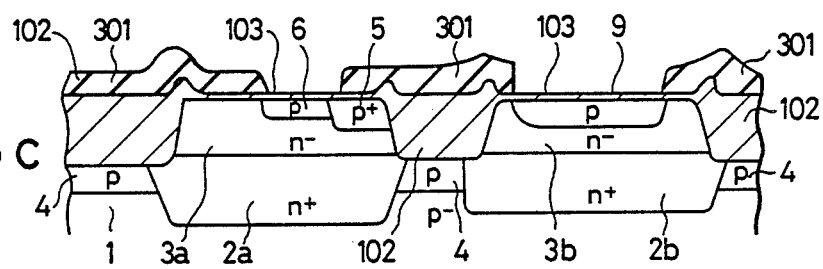
Figure 6D:
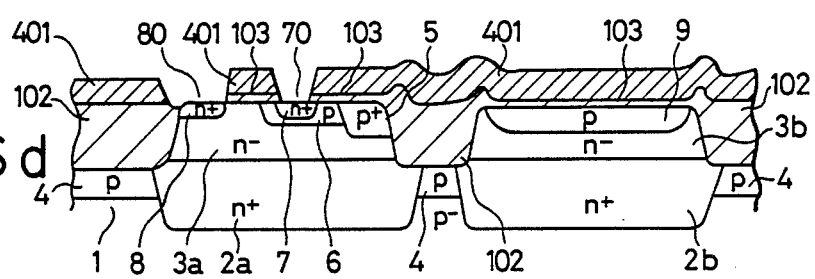
Figure 6E:
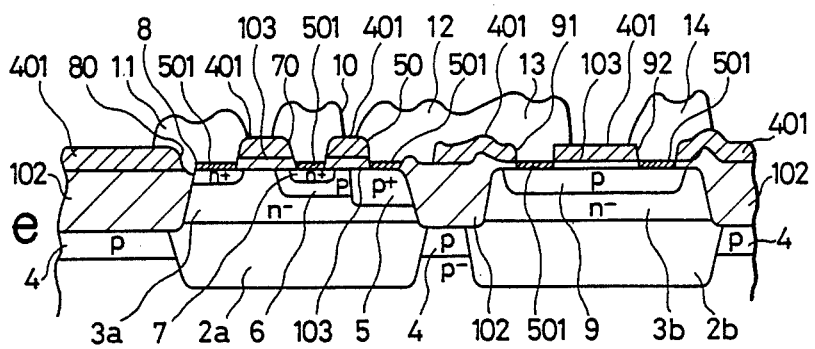

In the initial steps of the fabrication process, which are similar to those of the prior art through FIG. 6b, an $n^+$-type buried collector layer 2, an $n^-$-type epitaxial layer 3, a p-type channel cut zone 4, and an isolation oxide film 102 are formed on a $p^-$-type silicon substrate 1. The isolation oxide film 102 of FIG. 1 is similar to that of FIG. 6 but extends to the resistor layer. Then the nitride layer 201 in FIG. 6b is removed and a polysilicon film to form the resistor layer 601 shown in FIG. 1a is deposited. Instead of polysilicon, this silicon layer can also be formed of amorphous silicon, single-crystal silicon, porous silicon, or the like. This polysilicon layer is then patterned by the well-known techniques of photolithography and etching to leave a resistor length equivalent to the largest resistance value that may be required.

Next the oxide underfilm 101 is removed and an oxide film 103 (shown in FIG. 1a) is formed for ion implantation protection. Ion implantation steps using a photoresist film not shown in the figure, as a mask, are performed to create a p-type active base region 6 and a $p^+$-type external base region 5 in a part of the surface of the $n^-$-type collector layer 3 to have one side bounding on the isolation oxide 102. Ion implantation in the patterned first polysilicon layer is also performed, either during the external base ion implantation step or in a separate step, to create the resistor region 601. An annealing step is carried out either immediately after the ion implantation of the resistor and external base region or later after ion implantation of the active base zone, and then the oxide film 402 is deposited. This oxide film may be undoped, or it may be doped with a 1% to 2% mole concentration of phosphorous (P) to maintain a slight passivation effect.

Next the emitter contact window 70, base contact window 50, and collector contact window 80 shown in FIG. 1b are formed simultaneously, and the second polysilicon layer 602 is deposited, and this polysilicon layer 602 is dosed with a high concentration of $n^+$-type impurities by ion implantation, using the resist film 302 as a mask. This step is followed by slight annealing to achieve a uniform distribution of $N^+$-type impurities in the seoncd polysilicon layer 602. After annealing, patterning is layer 602 which covers the emitter and collector contacts. Incidentally, because of the high diffusion coefficient of impurities in polysilicon and amorphous silicon, a uniform distribution extending to the interface with the basic silicon layer can be obtained by annealing at a relatively low temperature (about 900° C.) for a short time. The purpose of this step is to mimimize the take-up of impurities by the later metal silicide formation step. It is also possible to perform ion implantation of $n^+$-type impurities over the whole surface with no resist layer, and preform patterning, and then annealing.

Next, as shown in FIG. 1c, the oxide film 402 covering the resistor layer 601 is patterning-removed to open windows, and a metal silicide film 501 is formed in the windows. As a result of the window-opening the part beneath the remaining oxide film 402 serves as a resistor. Thus, the patterning step determined the resistor length. Metal silicide films such as $TiSi_2$ and $WSi_2$ are known to have a resistivity of only a few ohms per square, so the resistance value is determined almost completely by the formation fo the window formed in the metal silicide film. The window determined the position of contact formed in the later step. The metal silicide film is formed by the well-known process of depositing a metal such as titanium (Ti) or tungsten (W), then annealing at a low temperature (300° C. to 600° C.).

After creation of the passivation layer 401 shown in FIG. d next an annealing step is performed to sinter and to reflow (for removing sharp edges) this passivation layer 401 and to diffuse impurities from the polysilicon layer to the emitter region. Then contact windows are opened (as in the prior art) and low-resistance metal electrodes 11, 10, 12, and 14 are formed. It is also possible to employ as the passivation layer 401 an oxide layer formed by plasma deposition or sputtering, or a nitride film.

Next the functions and effects are described.

Figure 2:
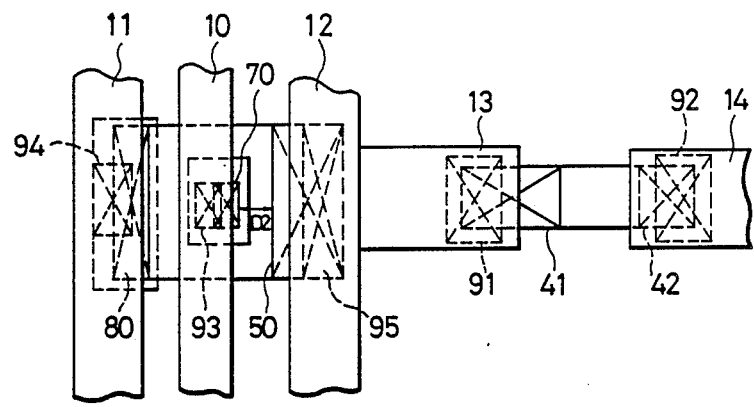
FIG. 2 is a plan view of a transistor fabricated by the method of an embodiment of this invention.

FIG. 2 is a plan view of a transistor fabricated by the above-described method.

As described above, impurities are diffused from the polysilicon layer 602 into the emitter region, so that a shallow junction is formed and the high-frequency characteristics of the transistor are improved. In addition the distance $D_2$ between the emitter and base is extremely small, because it is determined by the windows 50 and 70 and not be the low-resistance interconnections 10 and 12, so that the base resistance is greatly reduced. The positions of the contacts 93 and 95, which are determined by the accuracy of the low-resistance interconnection photolithography, can be selected independently of the locations of the windows 50 and 70 because the low-resistance interconnection are linked to the emitter and base regions by the metal silicide film.

Figure 3:
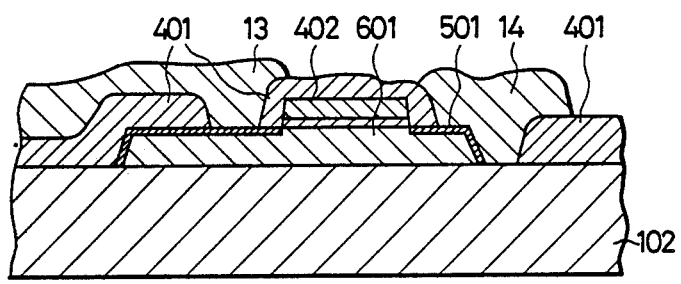
FIG. 3 is a sectional view of the resistor fabricated by the method of the embodiment of this invention.
Figure 4:
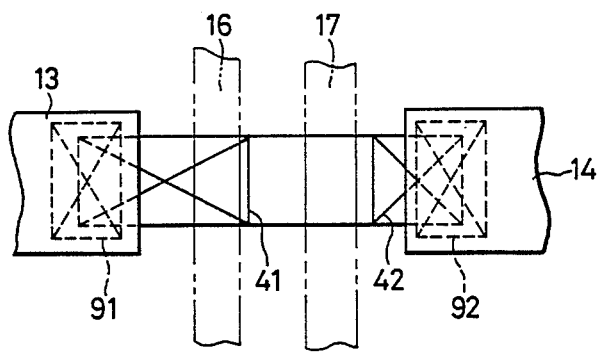
FIG. 4 is a plan view of the same.
Figure 5:
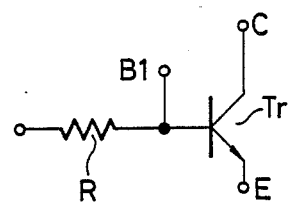
FIG. 5 is a diagram of the circuit, comprising a transistor and a resistor, of this invention and the prior art.
Figure 7:
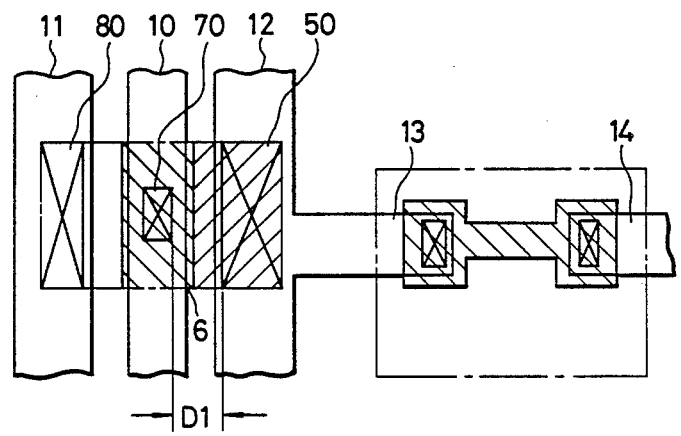
FIG. 7 is a plan view of a transistor fabricated by the prior art.
Figure 8:
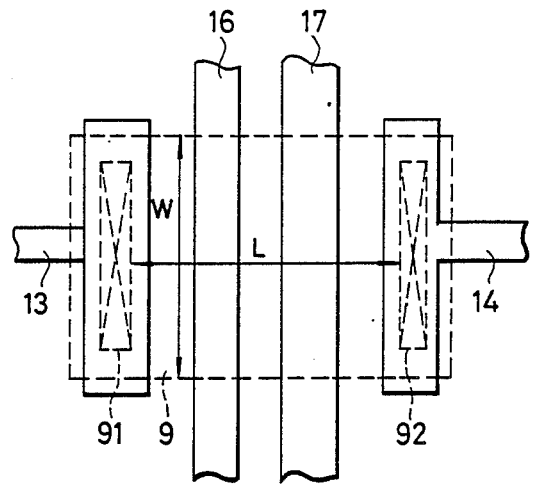
FIG. 8 is a plan view of a resistor fabricated by the prior art.
Figure 9:
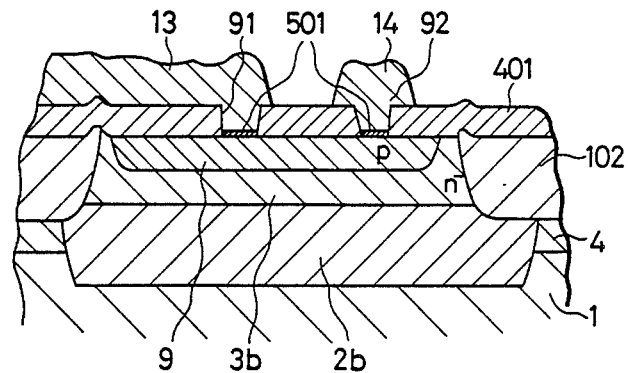
FIG. 9 is a sectional view of a resistor fabricated by the prior art.

As shown in FIG. 3, in this embodiment the resistor 601 formed of the first polysilicon layer is formed on the field oxide film 102, so there is no increase of capacitance. As can be seen in FIG. 4, which corresponds to FIG. 8 of the prior art, when interconnection line 16 and 17 are routed over the resistor 9 and the resistance of the resistor 9 needs to be low, there is no need to increase the resistor length and hence the resistor width because the interconnection line is made by the metal silicide from the window 41 that determined the resistance value to the contact 91. This property, coupled with the lack of need for isolation of the first polysilicon layer (resistor layer) from the transistor region, enables higher intergration densities. Moreover, instead of using the first polysilicon layer 601 for forming resistors the entire surface may be exposed as a window, and a metal silicide film may be formed throughout the window, to be used as a apolycide interconnection. Freedom of design is thereby further increased.

According to this invention a first silicon layer to form a resistor is created, a second polysilicon layer is created over the emitter region of the purpose of introducing impurities into the region, and a metal silicide film is formed on the first and second silicon layers. It is thereby possible to obtain a semicondutor integrated circuit with excellent high-frequency characteristics, permitting high integration densities and a high degree of freedom of design.

What is claimed is:

1. A semiconductor integrated circuit device comprising:
   a semiconductor substrate:
   a semiconductor device formed on said semiconductor substrate and having at least one PN junction;
   a resistor formed of a first silicon layer formed on an insulating film on the semiconductor substrate; and
   a metal silicide film formed on the surface of said first silicon layer; and
   an interconnection layer distinct from said metal silicide film and coupled to said metal silicide film and said semiconductor device for providing an electrical communication path between said resistor and said semiconductor device.

2. A semiconductor integrated circuit device according to claim 1, wherein the first silicon layer is covered with a second insulating film except where the metal silicide film is formed.

3. A semiconductor integrated circuit device according to claim 1, wherein the interconnection layer has contact with the metal slicide film formed on a first part of the first silicon layer, and has contact with the semiconductor device.

4. A semiconductor integrated circuit device according to claim 3, further comprising an insulating film covering the first silicon layer, except where the metal silicide film is formed, and a passivation film covering part of the metal silicide film adjacent the insulating film, wherein said interconnection layer has contact with a first part of the metaol silicide film not covered by the passivation film.

5. A semiconductor integrated circuit device according to claim 4, wherein the interconnection layer has contact with a second part of the metal silicide film formed on a second part of the first silicon layer, said second part of the metal silicide film being separated by the insulating film from said first part of the metal silicide film, whereby part of the first silicon layer under the insulation film and between said first and second parts of the metal silicide film forms the resistor.

6. A semiconductor integrated circuit device according to claim 4, wherein the insulating film is a silicon oxide film.

7. A semiconductor integrated circuit device according to claim 4, wherein the semiconductor device is a bipolar transistor having a base region, and the metal silicide film has contact with the base region of the bipolar transistor.

8. A semiconductor integrated circuit device according to claim 3, wherein
the semiconductor device is bipolar transistor having a base region, an emitter region and a collector region;
the semiconductor integrated circuit device further comprises a second silicon layer formed over the emitter region on the semiconductor substrate; and
the metal silicide film is further formed on said second silicon layer.

9. A semiconductor integrated circuit device according to claim 8, wherein
the transistor comprises a first window for the introduction of impurities into the emitter region and a second window for the base contact.

10. A semiconductor integrated circuit device according to claim 1, wherein the first silicon layer is a polysilicon layer.

11. A semiconductor integrated circuit device comprising:
a semiconductor substrate;
an insulating layer formed on the semiconductor substrate;
a first silicon layer formed on the insulating layer;
a first metal silicide film and a second metal silicide film formed on the first silicon layer, wherein a portion of the first silicon layer is not covered by said first metal silicide film and said second metal silicide film thereby separating said first metal silicide film and said second metal silicide film and forming a resistor on said first silicon layer, and
an interconnection layer distinct from said first metal silicide film and coupled to said first metal silicide film and a semiconductor device formed on said semiconductor substrate for providing an electrical communication path between said resistor and said semiconductor device;
said first metal silicide film and said second metal silicide film forming a pair of electrodes for the resistor.

12. A semiconductor integrated circuit device according to claim 11, wherein the first silicon layer is covered with an insulating film except where the metal silicide film is formed.

13. A semiconductor device according to claim 11, wherein said semiconductor substrate is a silicon substrate and said insulating layer is a silicon oxide.

14. A semiconductor integrated circuit device according to claim 12 wherein said first silicon layer is a polysilicon.

15. A semiconductor integrated circuit device comprising;
a semiconductor substrate;
a semiconductor device formed on said semiconductor substrate and having at least one PN junction;
a first silicon layer formed on an insulating film on the semiconductor substrate;
a metal silicide film formed on the surface of said first silicon layer;
an interconnection layer distinct from said metal silicide film and coupled to said metal silicide film and said semiconductor device; and
a resistor formed from at least one window opened in said metal silicide film,
wherein said resistor is in electrical communication with said semiconductor device by way of said interconnection layer.

* * * * *